United States Patent [19]
Madni et al.

[11] Patent Number: 5,345,239
[45] Date of Patent: Sep. 6, 1994

[54] HIGH SPEED SERRODYNE DIGITAL FREQUENCY TRANSLATOR

[75] Inventors: Asad M. Madni, Los Angeles; Lawrence Wan, Fountain Valley, both of Calif.

[73] Assignee: Systron Donner Corporation, Concord, Calif.

[21] Appl. No.: 219,825

[22] Filed: Jun. 16, 1988

Related U.S. Application Data

[63] Continuation of Ser. No. 797,149, Nov. 12, 1985, abandoned.

[51] Int. Cl.⁵ ............................................. G01S 7/36
[52] U.S. Cl. ............................................. 342/14
[58] Field of Search .......................... 342/13, 14, 175; 328/55, 155; 307/262, 511; 333/109, 139, 156

[56] References Cited

U.S. PATENT DOCUMENTS

| | | | |
|---|---|---|---|
| 3,238,300 | 3/1966 | Bopp et al. | 333/139 X |
| 3,382,379 | 5/1968 | Lawless | 307/511 X |
| 3,517,223 | 6/1970 | Gaunt, Jr. | 307/511 |
| 3,612,916 | 10/1971 | O'Neill | 307/511 |
| 3,882,431 | 5/1975 | Hopwood et al. | 333/139 |
| 4,003,078 | 1/1977 | Owen | 328/155 X |
| 4,101,821 | 7/1978 | Kirby | 328/155 X |
| 4,232,399 | 11/1980 | Heiter | 328/155 X |
| 4,297,641 | 10/1981 | Sterzer | 342/14 |
| 4,395,687 | 7/1983 | Belohoubek | 328/155 X |
| 4,599,585 | 7/1986 | Vorhaus et al. | 333/139 X |

*Primary Examiner*—Mark Hellner
*Attorney, Agent, or Firm*—Flehr, Hohbach, Test, Albritton & Herbert

[57] ABSTRACT

A high-speed serrodyne digital frequency translator utilizes a digital phase-shifter, for example, of series coupled Schiffman type cells, which have reference and delay paths which are switched by three-terminal devices of the gallium arsenide FET type. No bias voltages are used and the FETS are driven by the output of a binary divider network which in turn is composed of GaAs FETS as active elements. Thus switching in the picosecond range results.

8 Claims, 5 Drawing Sheets

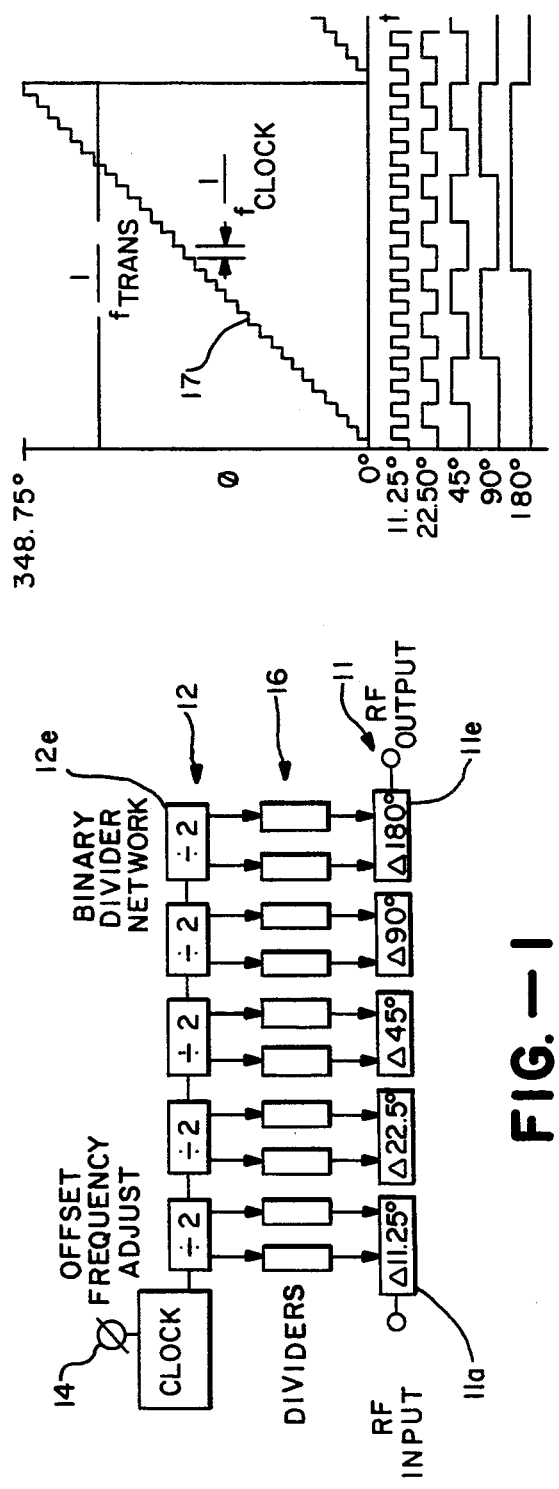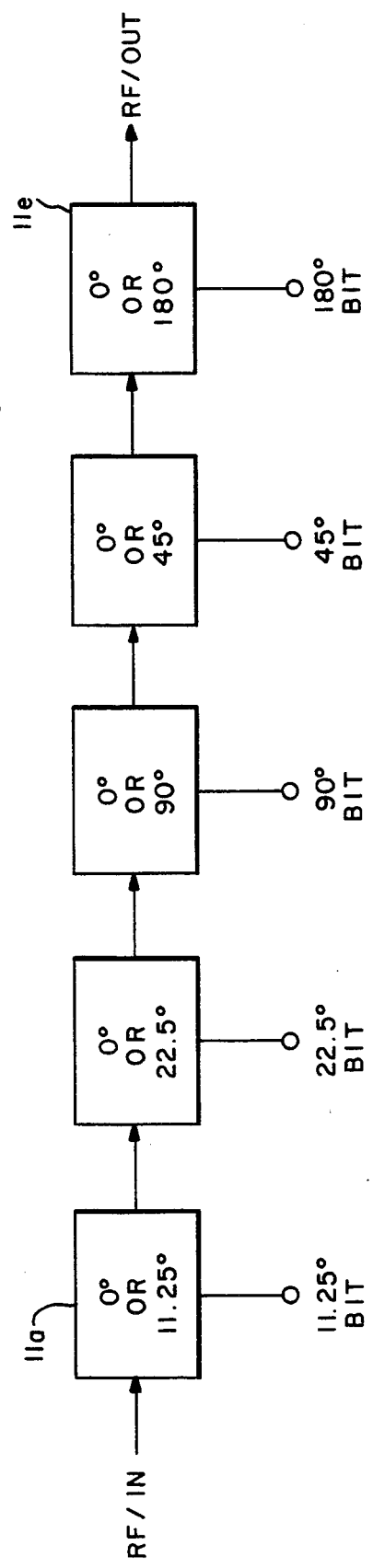
FIG.-1
FIG.-2
FIG.-3

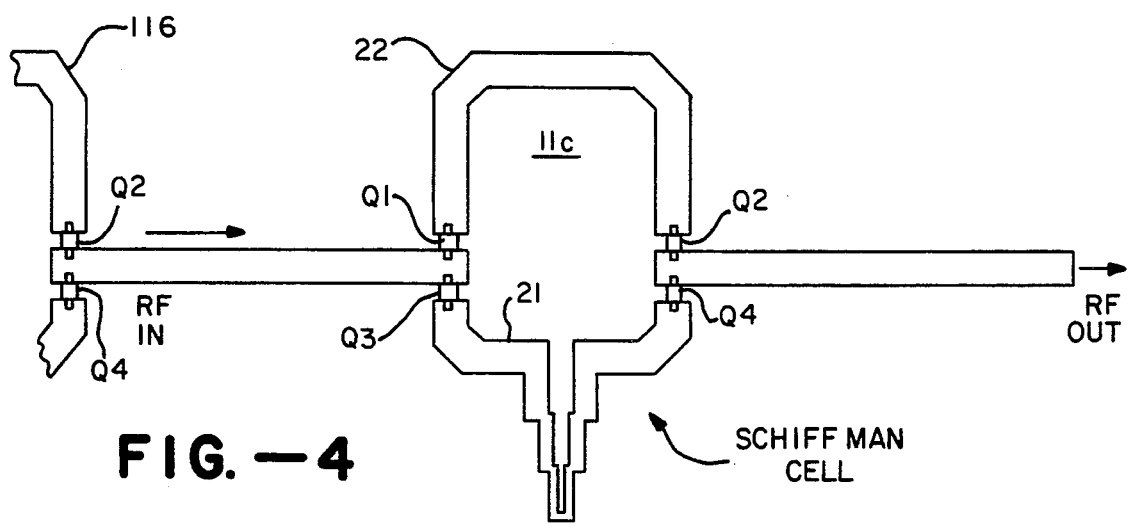
FIG.—4
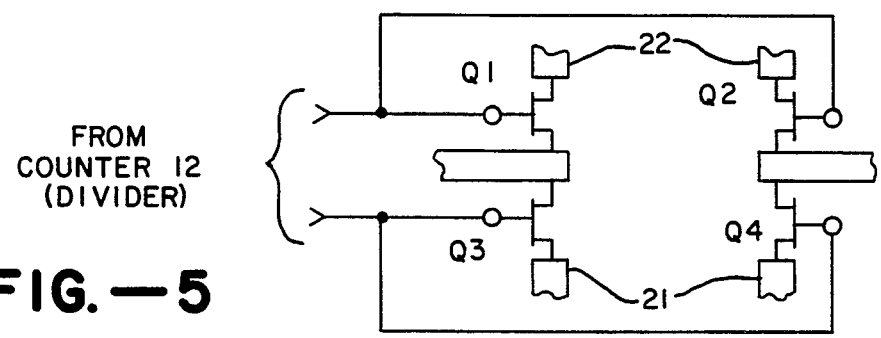
FIG.—5
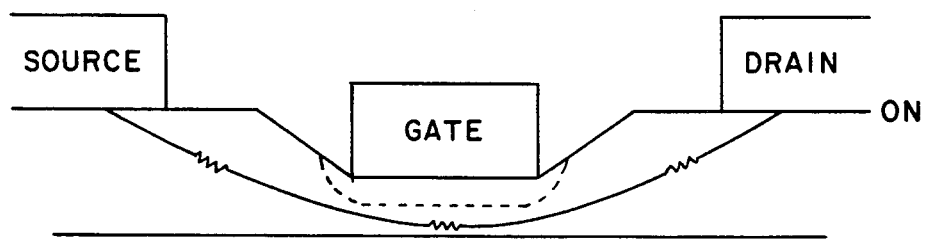
FIG.—6A
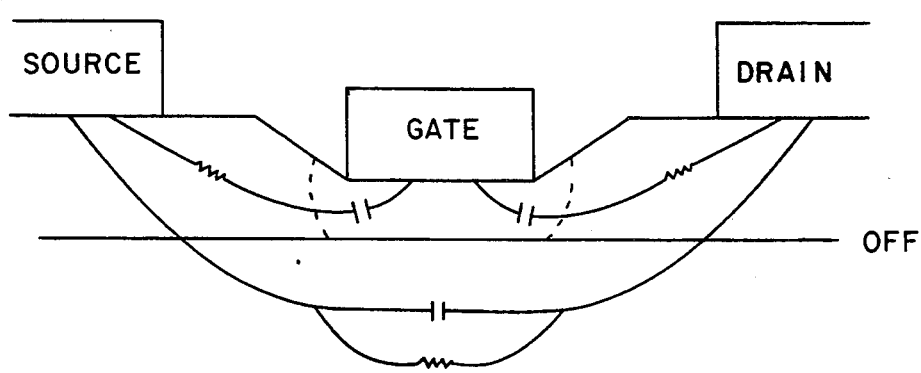
FIG.—6B

HI-LOW PASS
$X_N = \tan \frac{\Delta\phi}{4}$
$B_N = \sin \Delta\phi/2$
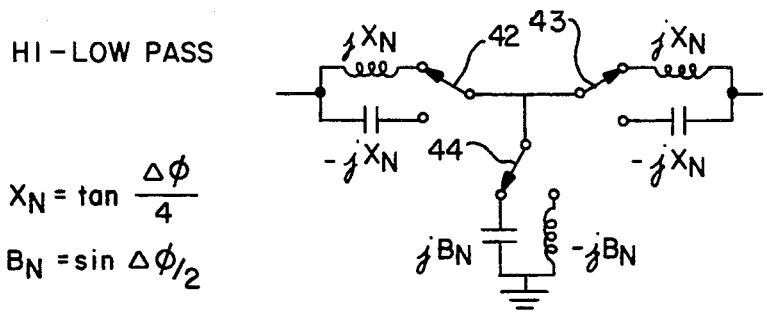
FIG.—9D
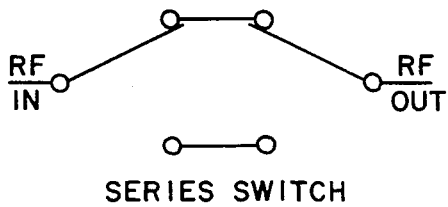
SERIES SWITCH
FIG.—10A
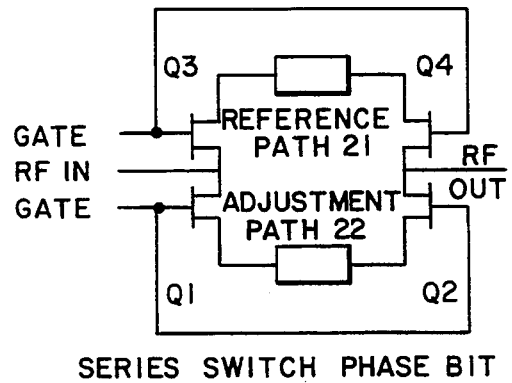
SERIES SWITCH PHASE BIT
FIG.—10B
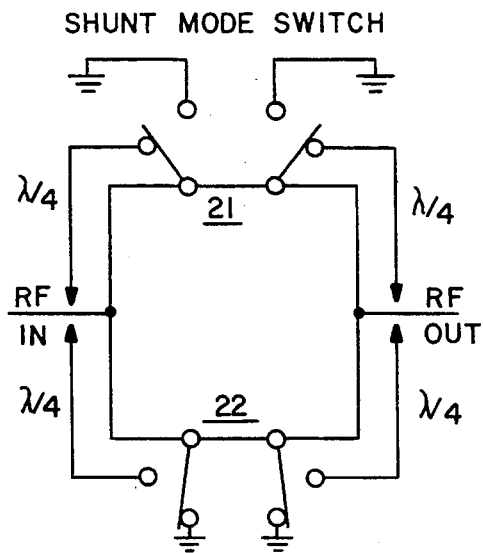
FIG.—11A
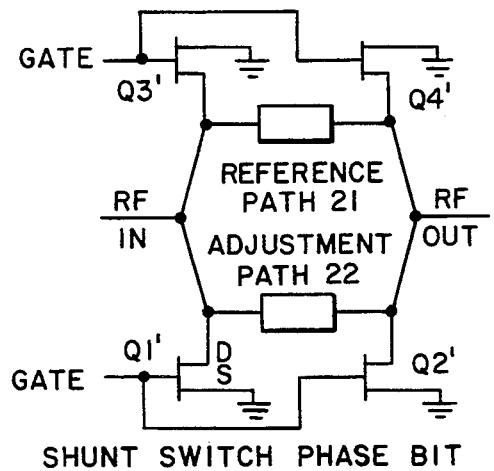
SHUNT SWITCH PHASE BIT
FIG.—11B

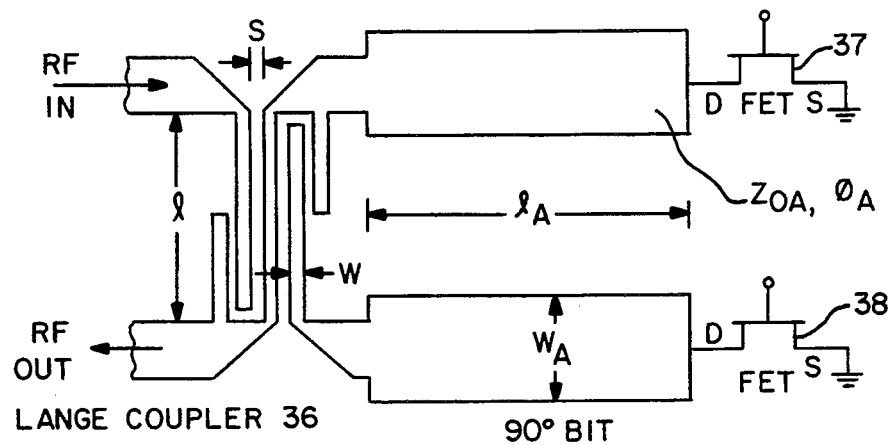
FIG.—12
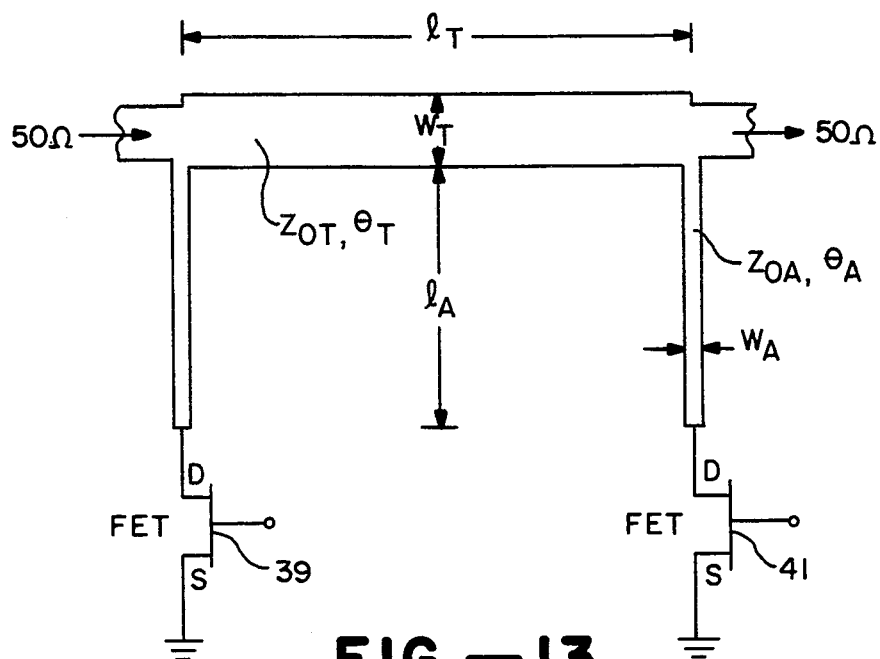
FIG.—13
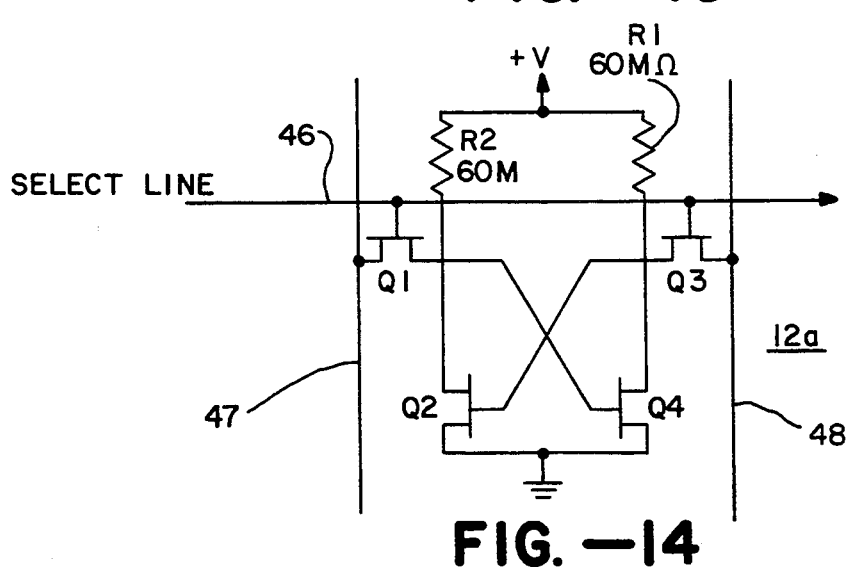
FIG.—14

HIGH SPEED SERRODYNE DIGITAL FREQUENCY TRANSLATOR

This is a continuation of application Ser. No. 797,149 filed Nov. 12, 1985 now abandoned.

BACKGROUND OF THE INVENTION

The present invention is directed to high speed digital phase shifting apparatus and more particularly to digital frequency translation using the serrodyne principle.

Fast phase shifters are required in several areas particularly in the radar and Electronic Counter Measures (ECM) fields. In general, the phase shifters use a serrodyne system where swift phase changes result in nearly pure sideband generations. Serrodyning is a prevailing ECM technique used to prevent continuous wave (CW) or doppler tracking radars from gaining accurate velocity information. Such a system is shown in co-pending application, Ser. No. 534,566, filed Sep. 22, 1983, in the names of Asad M. Madni and Joseph Fala (Asad M. Madni is one of the co-inventors of the present application), entitled: "VELOCITY DETECTION APPARATUS". The disclosure of the Madni/Fala application is hereby incorporated by reference.

That application discloses a digital phase-shifter which produces a slowly changing false doppler frequencies. Thus, it performs a velocity gate stealer (VGS) function. VGS pulls the velocity tracker off the target return and drops it. The radar may then lock on to clutter or be forced into a reacquisition sequence. Typical frequency translations for the VGS function are between 20 Hz and 200 KHz which, for a 32-step operation implies clock frequencies of 6.4 MHz. Since the phase shifter must switch at least twice this rate, this implies a necessary switching frequency of 12.8 MHz or switching time of less than 20 nsecs. As disclosed in the above co-pending application, the switching time is met by, for example, utilizing a digital phase-shifter of the Schiffman type where each cell of the phase-shifter is driven by an output of a multi-bit counter whose clock input in turn is driven by a voltage-to-frequency converter which has a pulse train output. Each cell of the digital phase-shifter is sequentially switched in and out of the phase-shifter circuit by diode switches as disclosed in the above-mentioned pending application. Such diode switches may typically be of the PIN type (meaning P and N semi-conductor materials separated by an intrinsic layer). Typical switching speeds of PIN diodes are 10 nsecs with 2 to 3 nsecs achievable in some applications. Thus, PIN diode switches are very adequate for the foregoing requirement.

Another type of phase-shifter which can be utilized is a varactor phase-shifter. However, this requires a digital to analog converter. In combination with the limitations of the above conversion and the non-linearities in the varactor diode itself, a varactor type phase-shifter suffers from poor accuracy, complexity and limited speed. In contrast a digital computer can drive a fully digital phase-shifter directly.

In addition to doppler and CW radar, there is a pulse compression radar which goes under the acronym CHIRP. Here, a gate stealer ECM technique can be generated in exactly the same manner as a velocity gate stealing technique, in that a range tracker is pulled off the true target return and then dropped. This, however, with use of a digital phase-shifter implies switching times in the order of pico-seconds. Such short times are not achievable using PIN diodes as switching elements.

OBJECT AND SUMMARY OF THE INVENTION

It is a general object of the present invention to provide an improved high-speed serrodyne digital phase-shifter.

In accordance with the above object, there is provided a phase-shifter apparatus for receiving radar or other microwave signals and phase-shifting or frequency translating them comprising a solid state variable phase-shifter including a plurality of series coupled cells for inserting various and different phase shifts into the received microwave signals by binary inputs to selected cells. Each of the cells provides at least two expected phase shifts, one of which may be zero degrees, so that driving said binary inputs with an incrementally increasing binary number will cause step increases in expected phase shift of the series combination of the cells.

Each of the cells includes switching means responsive to a binary input for causing the cell to have one of the expected phase-shifts. The switching means includes at least a three-terminal gallium arsenide field effect transistor (GaAs FET) having no d.c. bias and a gate input which is driven by the binary input.

Multi-bit counter means are provided which have a number of binary outputs corresponding to the binary inputs of the plurality of cells for providing the binary number. Means are provided for digitally driving the counter means.

DESCRIPTION OF THE DRAWINGS

FIG. 1 is a block diagram of apparatus incorporating the present invention.

FIG. 2 is a timing diagram illustrating the operation of the invention.

FIG. 3 is a simplified block diagram illustrating the operation of FIG. 1.

FIG. 4 is a simplified plan view of a phase-shifter portion of FIG. 1.

FIG. 5 shows the switching circuits portion of FIG. 4.

FIGS. 6A and 6B show two different conditions for the switches utilized in FIGS. 4 and 5.

FIGS. 9A through 9D show alternative embodiments of digital phase-shifters useful in the present invention.

FIGS. 10A and 10B illustrate a series mode operation.

FIGS. 11A and 11B illustrate a shunt mode operation.

FIG. 12 is a plan view illustrating the phase-shifter of FIG. 9B for a 90° cell.

FIG. 13 is a simplified plan view illustrating the phase-shifter of FIG. 9C.

FIG. 14 is a circuit schematic of one of the divide-by-two units of FIG. 1.

DESCRIPTION OF PREFERRED EMBODIMENTS

Figure 7:
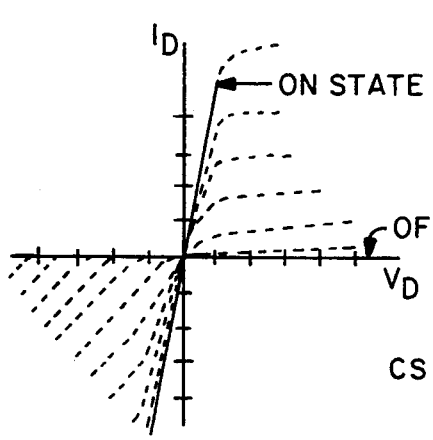
FIG. 7 shows the characteristic curve of the switches in FIGS. 6A and 6B.

FIG. 1 illustrates the basic circuit for accomplishing the serrodyning technique of the present invention. This is, of course, a phase modulation using the transit time modulation of the phase-shifter. As illustrated, phase-shifter 11 is a solid-state digital phase-shifter which consists of five sections or cells which can be switched in and out of a series path to insert various and different phase shifts into the radio frequency (RF) circuit. It should be noted that in the present invention the RF frequencies with the CHIRP type of radar would be in the gigahertz range. The radio frequency input is received at one end of the phase-shifter (RF input), phase-shifted and outputted at the other end (RF output). Within each of the five cells 11a through 11e, there is indicated the respective phase-shift; viz: $11\frac{1}{4}°$, $22\frac{1}{2}°$, $45°$, $90°$ and $180°$. The cells are driven by a multi-bit counter 12, which is in the form of a binary divider network, the counter 12 being driven by a clock 13 having an offset frequency adjustment 14. The output of each unit of counter 12, that is 12a to 12e (which may be merely flip-flop circuits), is coupled to phase-shifter 11 by driver pairs 16 which may be diodes or FETs. These binary inputs to the phase-shifter serve the purpose of turning the individual units on and off.

This overall functioning is illustrated in FIG. 2 which shows each individual cell of the phase-shifter 11 designated by its number of degrees of phase-shift as it is driven by the counter 12. Normally, the counter counts up an incrementally increasing binary number which causes a step increase in the expected phase-shift of the series combination of cells as indicated by the stepped curve 17. In this case since it is a five-bit phase-shifter, there are 32 steps. Frequency translation takes place over one period of the translation frequency. Thus, for 32-step operation, the clocking frequency of clock 13 must be 32 times this translation frequency. Thus, it is apparent that in the CHIRP type of radar, the phase-shifter which switches at approximately twice the above rate must operate in the pico-second range. Any time delay of the switching of the individual cells of the phase-shifter will result in undesired amplitude notching of the output due to switching crossover dropouts in the switch. This results in amplitude modulation components at the clock frequency on the spectrum. The present invention by reducing the delay time of the above switching, eliminates such deleterious side effects.

FIG. 3 illustrates the foregoing operation in simplified format, where the various cells 11a–11e of the phase-shifter are illustrated, which in their preferred embodiment may be of the Schiffman type. Here in one of phase delay modes, there is a zero degree phase-shift and as indicated another designated phase-shift. The input control bits are only indicated schematically as one line control which control the state of the cell in a manner as illustrated in FIG. 2.

FIG. 4 illustrates in detail a typical Schiffman type cell, for example, 11c and a portion of an adjacent cell 11b. Referring to cell 11c, there is a reference path 21, meaning a nominal zero degree phase-shift, and also a delay or adjustment path 22 which, for example, might be 90°. This cell is switched between these two conditions by the switching pairs, Q1, Q2 and Q3, Q4. This is better illustrated in FIG. 5. These switches are naturally a key link in the overall pico-second speed of the circuit. As will be discussed in further detail below, they are gallium arsenide, field effect transistors (GaAs FET). Such a GaAs FET can switch at a very high speed with a transition time of around 150 pico-seconds. In addition, no power is required to drive their gates, and no bias is required on the drain or source. As indicated clearly in FIG. 5, the specific connection of each GaAs FET is that of a three-terminal device with the drain and source connected between either the delay path 22 or the reference path 21. These switches are driven by the binary outputs of counter (divider) 12.

Since no d.c. bias is required on switches Q1–Q4, the adjacent phase-shift cell 11b, as shown in FIG. 4, may be directly connected, without the need of an isolating capacitor, to the cell 11c.

Figure 8A:
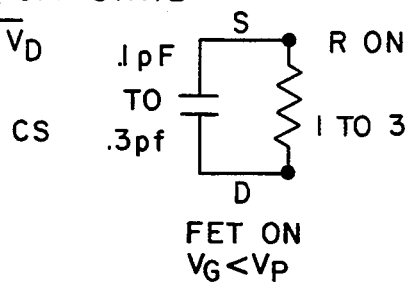
FIGS. 8A, 8B and 8C are typical equivalent electrical circuits of the switch of FIGS. 6A and 6B.
Figure 8B:
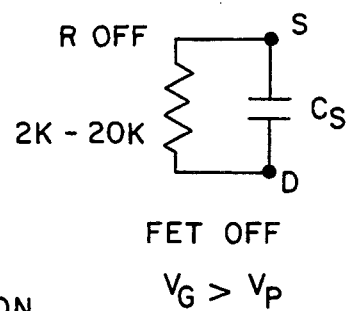

Referring to the FIGS. 6A and 6B, these illustrate a cross-section of the GaAs FET in "on and off" states, respectively. As is apparent it is a three-terminal device with a source, a drain and a gate terminal. A gate voltage $V_G$ controls the switched state. In a typical switch mode, the high impedance or off state corresponds to a negative gate bias, higher in magnitude than the pinch-off voltage $V_p$. This is illustrated in FIG. 8B. FIG. 8A shows the on-condition which is a low-impedance state (1 to 3 ohms, for example). Here the gate voltage is, of course, less than pinch-off voltage. In either state virtually no d.c. bias power is required.

FIG. 7 illustrates the two "on and off" operating regions of the GaAs FET. It is apparent that the operating regions are very linear.

Figure 8C:
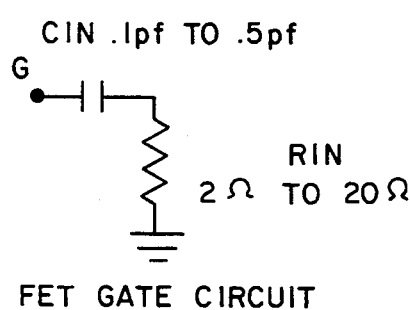

In the "on" state (FIG. 6A), the device can be modeled as a linear resistor, as illustrated in FIG. 8A. The capacitance is minimal and typically of the range of 0.1 pF to 0.3 pF. When a negative gate voltage is applied between gate and source so that it is greater than the pinch-off voltage, the channel underneath the gate can be depleted of charge carriers as illustrated in FIG. 6B. In the "off" condition, the field effect transistor can be modeled as a resistor, capacitor combination, as illustrated in FIG. 8B. Here, the "off" resistance is typically 2 kilohms to 20 kilohms. Finally, the gate circuit equivalent is shown in FIG. 8C as a series capacitor of 0.1 pF to 0.3 pF and a resistor of 2 ohms to 20 ohms. Switching occurs only through the gate control voltage and no other bias is required. In view of the gate circuit of FIG. 8C, the gate current is either zero or negligible. The FET switching time can be estimated from the equivalent gate circuit of FIG. 8C. With the nominal values of resistance and capacitance shown, the charging time constant is approximately 50 pico-seconds.

Figure 9A:
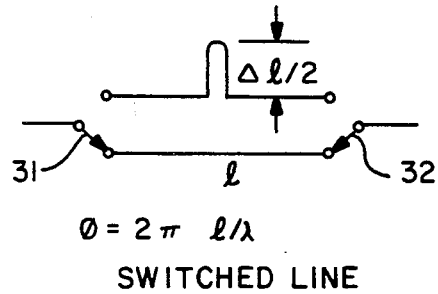

Various digital phase-shifters, in addition to the Schiffman type, may be utilized with the gallium arsenide FET switch of the present invention. FIG. 9A illustrates in very simplified form a switched line phase-shifter circuit (which is equivalent to a Schiffman cell) and which has in effect 2 single-pole double-throw switches 31 and 32. This permits either one of two paths to be selected as a transmission path. In the context of the Schiffman type cell, one path would be the reference of zero degree path, and the other the delay path. The formula for the amount of phase-shift $\Delta\Phi$ is illustrated in conjunction with the diagram. In the actual Schiffman cell, as schematically illustrated in FIG. 5, rather than utilizing the single-pole double-throw switches, pairs of GaAs FETS are utilized with their gates tied together.

Figure 9C:
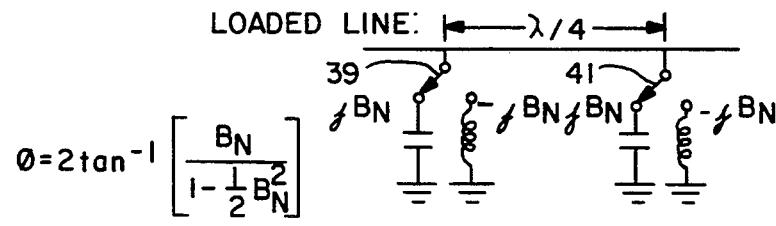
Figure 9B:
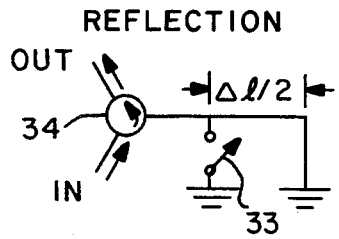

Next in complexity is a reflection type phase-shifter illustrated in FIG. 9B. When switch 33 is closed, the plane of reflection is in the plane of the switch; when the switch is open, the plane of reflection is at the short. A circulator 34 is also a part of the circuit.

In general, all phase-shifter cells or "bits" can be implemented using FET's in a shunt mode configuration or a series mode configuration.

In the series mode, as illustrated in FIGS. 10A and 10B, the signal path is between the FET source and drain which can be made to open (high resistance) or close (low resistance) by applying gate voltage. FIG. 10B is, therefore, equivalent to the Schiffman cell 11c and its FET switches 21–24 of FIGS. 4 and 5. However, this can be implemented in the shunt mode also.

In the shunt mode, as illustrated in FIGS. 11A and 11B, the FET (viz: Q1′–Q4′) is placed across the signal path (drain connection)to the ground (source connection). Turning the FET on by means of the gate, produces a low resistance from drain to source effectively shorting the signal to the ground. Used in conjunction with quarter wavelength transmission lines (see FIG. 11A), this short produces an open circuit at the RF input to the switch. Thus, referring to FIG. 11A, path 22 would be open and path 21 closed (where switches Q3′ and Q4′ are off).

FIG. 12 shows an actual physical layout of the 90° cell of a reflection type phase-shifter (FIG. 9B). It includes a Lange coupler 36, plus a pair of gallium arsenide FETS 37 and 38, with the source terminal grounded. Therefore, this is a shunt mode operation.

FIG. 9C shows a loaded transmission line type phase-shifter, where when shunt inductors are switched in by switches 39 and 41, phase velocity is increased. The quarter wavelength path between the elements causes a partial cancellation of their mis-matches. When the capacitor legs are switched in, phase velocity is reduced causing additional phase delay. An actual physical representation of such a loaded line shifter is shown in FIG. 13 where the switches 39 and 41 are gallium arsenide FETS with their source terminal grounded.

The fourth type of digital phase-shifter is illustrated in FIG. 9D which is of the Hi-Low pass type. The circuit elements are selected so that the T circuit is exactly matched, whether the switches are in a position to form a low-pass circuit or a high-pass circuit. There are three pairs of inductive-capacitive legs which are switched by the schematically indicated switches 42, 43 and 44, each of which would be replaced by a pair of GaAs FET switches. Thus, six GaAs FETS would be required for switching between the inductive capacitive pairs.

The rapid pico-second magnitude switching times of the phase-shifter 11 illustrated in FIG. 1, can only be obtained if the counter or binary divider network 12 has an equivalent switching time. This can be accomplished by use of GaAs FET switches in each of the flip-flop units 12a through 12e. FIG. 14 illustrates a standard figuration of a single unit, for example, flip-flop unit 12a, which includes 4 gallium arsenide FETS Q1 through Q4, which are actuated by a select line 46 and have the two output lines 47 and 48. These are equivalent to the lines which drive the diode drivers 16 of FIG. 1.

Besides speed, another advantage of the use of GaAs FET switches is that they, as a group, are integratable on one monolithic substrate. This again cuts delay times and increases speed. Also the GaAs FETS can be optimized for low pinch-off voltage to minimize gate swing and video switching spike leakage.

The GaAs FET switches can be implemented using several different types of FETS. This includes depletion mode metal, enhancement mode metal, and high electron mobility transistors, sometimes called modulation-doped FETS. The first two have gate delays of 50 to 100 pico-seconds, and the last a gate delay of 3 to 6 pico-seconds.

Thus, the present invention provides a very high speed serrodyne digital frequency translator by the use of three-terminal GaAs FET devices which heretofore have only been utilized as analog microwave amplifiers, for example. Since no d.c. bias is necessary, they are eminently suitable for use in digital phase-shifter applications, in that no coupling capacitors are necessary.

What is claimed:

1. Serrodyne phase-shifter apparatus for receiving radar or other microwave signals and phase shifting or frequency translating them comprising:

a solid-state variable phase shifter including a plurality of series coupled cells for inserting various and different phase-shifts into said received microwave signals by binary inputs to selected cells, each of said cells providing at least two expected phase shifts, one of which may be zero degrees, so that driving said binary inputs with an incrementally increasing binary number will cause step increases in expected phase shift of the series combination of the cells; each of said cells including switching means responsive to a said binary input for causing such cell to have one of said two expected phase-shifts, swid switching means including a plurality of three terminal gallium arsenide field effect transistors (GaAs FET) having no d.c. bias and a gate input which is driven by said binary input and source and drain terminals, said switching means including a first pair of said FETs, having a common gate input for providing one of said two expected phase shifts by forming a conductive path for said signals between said source and drain terminals and a second pair of said FETs, having a common gate input for providing another of said two expected phase shifts by forming a conductive path for said signals between said source and drain terminals;

multi-bit counter means having a number of binary outputs corresponding to said binary inputs of said plurality of cells for providing said binary number; and means for digitally driving said counter means.

2. Apparatus as in claim 1, where said counter means includes series connected flip-flop circuits, each with a pair of gallium arsenide FETS.

3. Apparatus as in claim 2 including clock means for driving said counter means.

4. Apparatus as in claim 1, where said cells are of the Schiffman type including reference path and a delay path and where said switching means alternately series connect such lines in response to said binary inputs.

5. Apparatus as in claim 1, where said cells are of the reflective type and said FETS have a source terminal grounded.

6. Apparatus as in claim 1, where said cells are of the loaded line type including inductive and capacitive legs and said FETS are connected as a pair to provide alternate switching between said legs.

7. Apparatus as in claim 1, where said cells are of the Hi-Low pass type having three pairs of inductive-capacitive legs and where six of said FETS provide switching between said pairs.

8. Apparatus as in claim 1, where said cells are d.c. coupled to each other.

* * * * *